(12) United States Patent
Burns et al.

(10) Patent No.: US 6,691,077 B1
(45) Date of Patent: Feb. 10, 2004

(54) CAPTURE AND CONVERSION OF MIXED-SIGNAL TEST STIMULI

(75) Inventors: Mark Burns, McKinney, TX (US); Craig D. Force, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/388,679

(22) Filed: Sep. 2, 1999

Related U.S. Application Data

(60) Provisional application No. 60/101,904, filed on Sep. 25, 1998.

(51) Int. Cl.[7] ................................................. G06G 7/48
(52) U.S. Cl. ............................... 703/4; 703/14; 703/15; 716/4
(58) Field of Search ................................ 703/14, 15, 4; 716/4

(56) References Cited

U.S. PATENT DOCUMENTS

| | | | | |
|---|---|---|---|---|
| 4,763,066 A | * | 8/1988 | Yeung et al. | 324/73.1 |
| 5,475,624 A | * | 12/1995 | West | 703/15 |
| 5,594,612 A | * | 1/1997 | Henrion | 341/120 |
| 5,786,778 A | * | 7/1998 | Adams et al. | 341/61 |
| 5,862,069 A | * | 1/1999 | Nestler | 708/620 |
| 6,011,765 A | * | 1/2000 | Nishio | 369/47.12 |
| 6,197,605 B1 | * | 3/2001 | Simunic et al. | 438/14 |
| 6,232,901 B1 | * | 5/2001 | Abbey | 341/123 |
| 6,374,379 B1 | * | 4/2002 | Walker et al. | 714/724 |

FOREIGN PATENT DOCUMENTS

EP   0 595 379 A2   5/1994

OTHER PUBLICATIONS

Dufort et al., "On–Chip analog signal generation for mixed signal built–in self–test", IEEE Journal of Solid–state circuits, Mar. 1999.*
Hawrysh et al. "An integration of memory based analog signal generation into current DFT architectures", Proceedings of the International test Conference, Oct. 1996.*
Dufort et al. "Signal generation using periodic single and multi–bit Sigma–delta modulated streams", Proceedings of the International test Conference, Nov. 1997.*
Rosenfeld, E, "Issues for Mixed–Signal CAD–Tester Interface", IEEE International Test Conference, 1989.*
Eric Rosenfeld, "Issues for Mixed–Signal CAD–Tester Interface," 1989 International Test Conference, Paper 26.4, pp. 585–590.
Schneider et al., "IntegraTEST: The New Wave in Mixed–Signal Test," International Test Conference, Paper 33.2, pp. 750–760.
Dufort et al., "Signal Generation Using Periodic Single and Multi–bit Sigma–delta Modulated Streams," 1997 Proc. IEEE International Test Conference, pp. 396–405.
Haurie et al., "Arbitrary–Precision Signal Generation for Bandlimited Mixed–Signal Testing," 1995 Proc. IEEE International Test Conference, pp. 78–86.

* cited by examiner

*Primary Examiner*—Samuel Broda
*Assistant Examiner*—K Thangavelu
(74) *Attorney, Agent, or Firm*—Bret J. Petersen; W. James Brady, III; Frederick J. Telecky, Jr.

(57) ABSTRACT

A technique for translating design test bench generated signals into an Automated-Test-Equipment compatible format using existing digital pattern conversion tools. The technique uses sigma-delta modulation technology to allow conversion of analog and mixed signal stimuli into digital representations that can be converted for use in the target tester using existing digital pattern conversion tools.

31 Claims, 7 Drawing Sheets

CAPTURE AND CONVERSION OF MIXED-SIGNAL TEST STIMULI

BACKGROUND AND SUMMARY OF THE INVENTION

The present invention relates to the field of electronic design and test, and specifically to the field of Computer Aided Engineering ("CAE") tools.

Background: Mixed-Signal Devices

Mixed-signal devices require synchronized analog and digital signals to be sourced to the Device-Under-Test ("DUT") for comprehensive test coverage. These mixed analog and digital signals are known as mixed-signal test stimuli. During the design process, a simulated mixed-signal stimulus is developed and sourced to a software model of the DUT. The DUT model's simulated response to this stimulus is compared against the expected response to verify the quality of the DUT's design before a physical DUT is manufactured. For years, software CAE tools have existed that can convert digital test signals into a format compatible with Automated Test Equipment ("ATE"). The digital test signals, called digital patterns, consist of one or more digital vectors. Each digital vector is a set of forced and/or expected ones and zeros that are applied to the DUT at a particular point in time during the execution of the digital pattern. Although there are many software tools that can capture and convert digital patterns to an ATE-compatible format, no CAE tool is available today that can perform a similar function on the analog AC and DC signals of a mixed-signal test stimulus. Therefore, the mixed-signal portion of the test program is generated by a test engineer, who uses mostly manual processes to create and measure sine waves, current, DC voltages, and digital patterns that work in combination with these analog signals to exercise the mixed-signal portions of the DUT. Consequently, generation of mixed-signal test programs is still a laborious and manual process.

Background: Traditional CAE Tools

Traditional CAE tools offer a method to convert digital signals from a design simulation test bench format to an ATE-acceptable format. The digital stimulus used on a DUT is created during the design phase of the DUT, and is converted for use during the testing of the DUT with the ATE.

In the prior-art design-to-test process, the designer typically verifies a design using software simulation tools. The digital patterns used to verify the design can be reused to generate a digital test program. Software tools are available from a number of vendors which allow the conversion of designer-generated digital vectors to an ATE-compatible format. However, in prior-art program generation methods there is no way to automatically convert mixed-signal test stimuli from the design environment directly to the test environment. The prior-art process including applying a modulated analog signal to a DUT is set forth in Benoit Dufort and Gordon W. Roberts, *Signal Generation Using Periodic Single and Multi-bit Sigma-delta Modulated Streams*, 1997 PROC.IEEE INTERNATIONAL TEST CONFERENCE 396-405; Xavier Haurie and Gordon W. Roberts, *Arbitrary—Precision Signal generation for Band-limited Mixed-Signal Testing*, 1995 PROC. IEEE INTERNATIONAL TEST CONFERENCE 78-86; and a related copending application entitled "Method and Apparatus to Generate Mixed Signal Test Stimulus" Ser. No. 60/057,271, filed Aug. 28, 1997 all of which are hereby incorporated by reference.

Capture and Conversion of Mixed-Signal Test Stimuli

The present application discloses a method which allows the capture and conversion of mixed-signal stimuli from design test bench generated signals to an ATE-compatible format. The disclosed method makes use of commercially available CAE tools. The invention advantageously uses a "software-generated stimulus modulator (or "StiModulator") based upon sigma-delta modulation/demodulation technology to allow conversion of digitally simulated analog test signals into digital pattern representations.

The invention takes advantage of prior-art methods (where a designer creates a test circuit for a DUT during the design process, and applies mixed-signal stimuli to that DUT by sourcing simulated digital, AC, and DC signals), by simply processing the digitally simulated analog signals through the StiModulator for storage into a CAE digital pattern file. These digital representations can then be converted to a format compatible with the target tester using existing digital pattern conversion tools.

The StiModulator produces a series of one-bit samples which are applied to a software model of a one-bit digital-to-analog converter (DAC) followed by a low-pass or band-pass reconstruction filter. The filter produces a digital representation of a reconstructed analog signal substantially equal to the digitally simulated source signal. The one-bit samples may also be converted to an ATE-format using the same software CAE tools commercially available for converting digital signal patterns for the DUT. The converted samples are applied to the DUT using ATE digital pin card drivers in the case of digital stimuli, and using pin card drivers in conjunction with reconstruction filters for analog stimuli.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Innovative Software StiModulator

Figure 6:
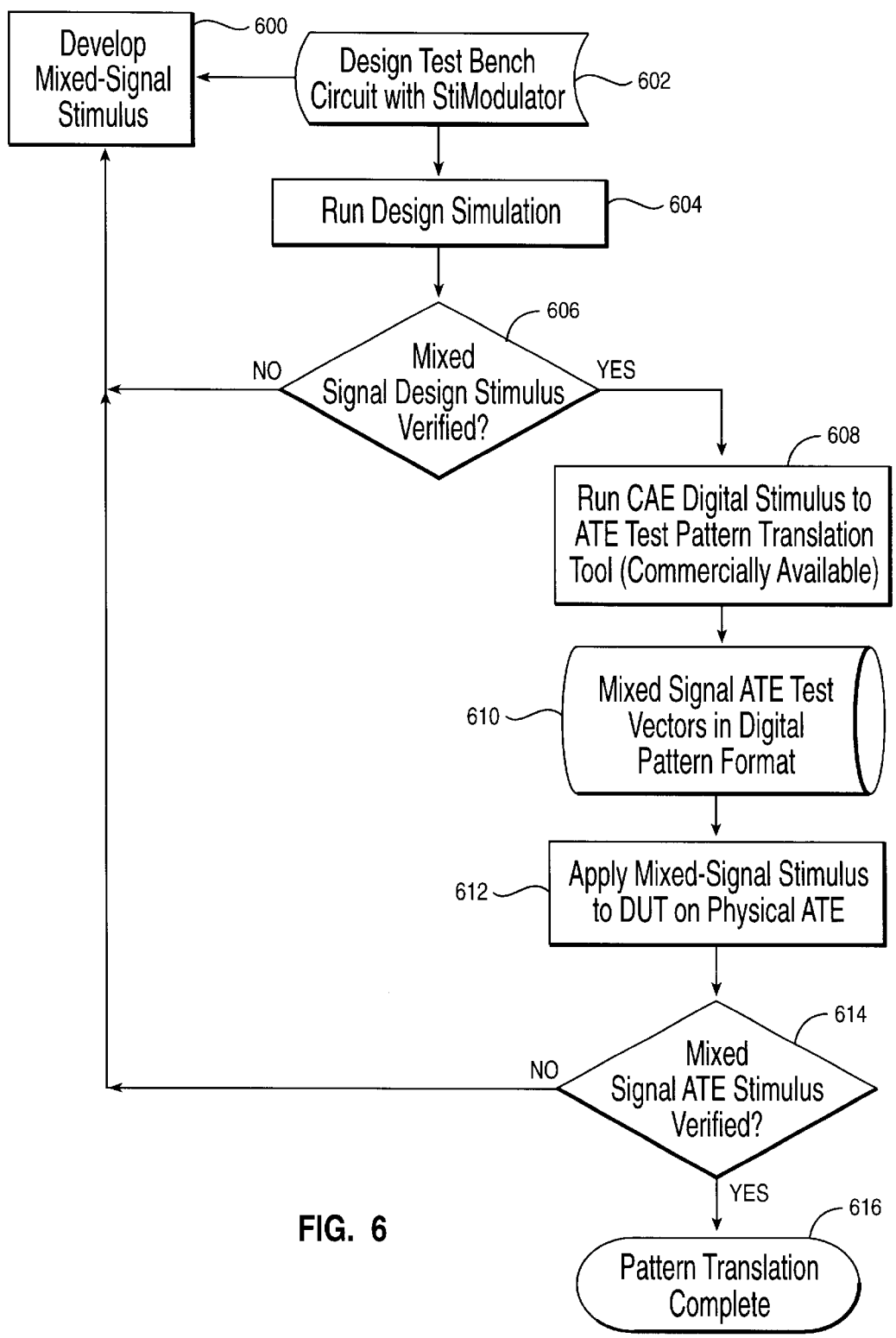
FIG. 6 shows a flowchart of the method employing the process of mixed-signal pattern translation and recreation.

FIG. 6 shows a flowchart of the method for employing the process of mixed-signal pattern translation and recreation. The process begins by developing the mixed-signal stimulus (Step 600). As the process occurs in a software test environment, it is important to remember that all signals are digital. That is, even the analog signals are digitally simulated. Therefore the analog signals must be recognized as digitally represented. The stimulus may comprise simulated AC and DC signals, and digital patterns to stimulate the DUT. Any of a number of mixed-signal simulators, for example SPICE™ or Spectre™, may be used to generate such test stimuli. A test bench circuit is then designed with one or more StiModulators (Step 602). Design simulations are run to verify the output of the test bench circuit (Step 604). If the simulations yield unacceptable results (Step 604), the process loops back to the stimulus development stage to modify the input parameters to achieve the desired results. If the stimuli are verified (Step 606), a translation tool (which is commercially available) is used to compile the verified stimuli for use with the DUT (Step 608). The translation tool converts the CAE digital stimuli to an ATE test pattern format (Step 610). The recreated mixed-signal stimuli are then applied to the DUT (Step 612). The mixed-signal ATE stimuli are verified, and if verification fails (Step 614), flow goes back to modify the initial mixed-signal values (Step 600) to achieve the desired results. If ATE stimulus verification is successful (Step 614), pattern translation is complete (Step 616).

Second-Order Sigma-Delta Modulator

Figure 5:
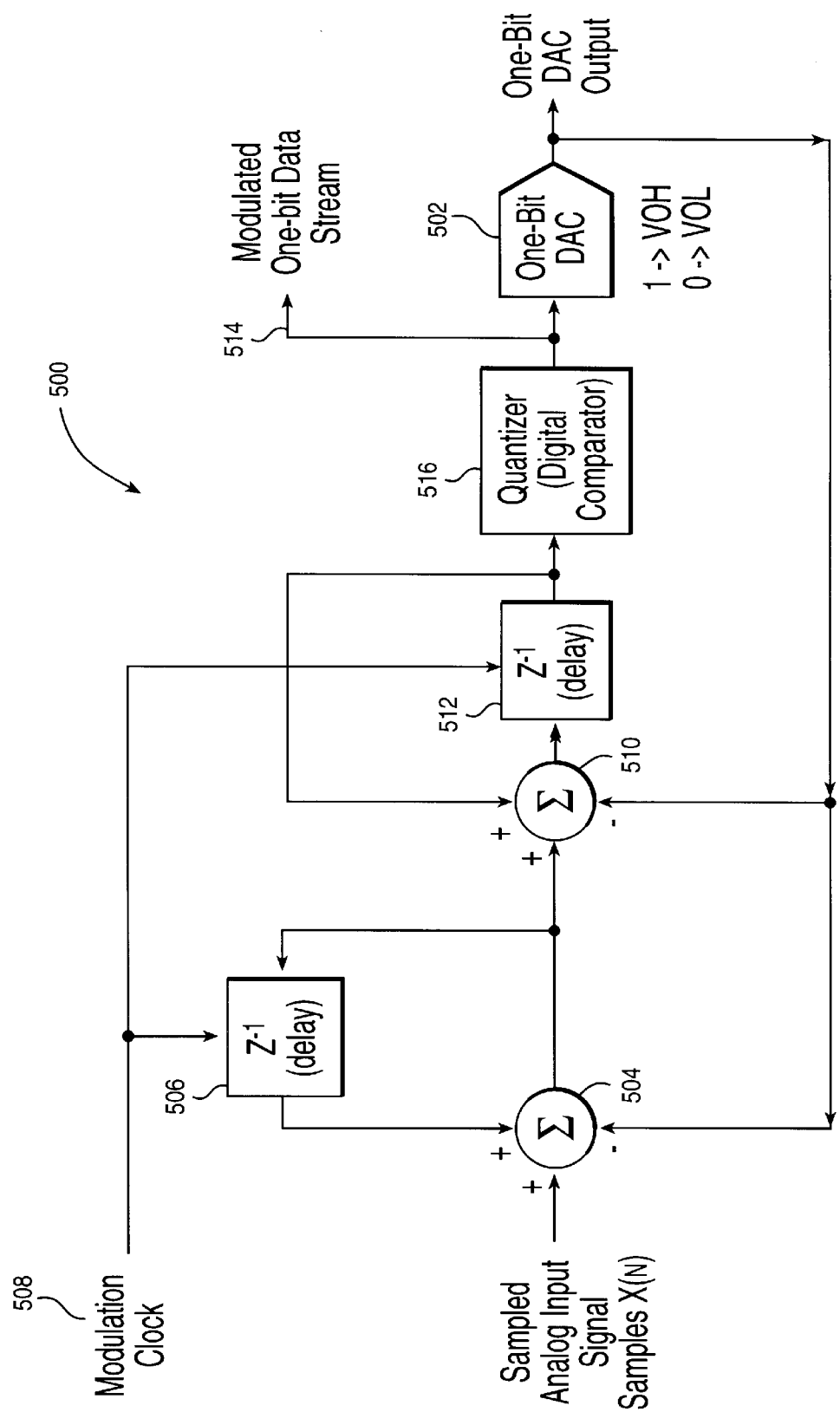
FIG. 5 shows a second-order sigma-delta modulator.

FIG. 5 shows a second-order sigma-delta modulator 500. The sigma-delta modulator 500 usually forms the first part of a sigma-delta digital-to-analog converter ("DAC"). The input signal in the software model is a digitally sampled analog signal. The sigma-delta modulator of the Stimodulator receives input samples, X(n), from discrete time representations of analog input. The input samples, X(n), are converted into a continuous stream of 1's (for a voltage above the comparator value) and 0's (for a voltage below the comparator value) at a rate determined by a sampling clock. A software model of a 1-bit digital-to-analog converter ("DAC") 502 is driven by the serial output data stream, and the DAC output is subtracted from the digitally sampled analog input signal, X(n), at addition element 504. (According to feedback control theory, the average value of the DAC output must approach that of the input signal if the loop has enough gain.) Two one-unit delays 506 and 512 are provided in a second-order sigma-delta modulator. The unit delays are controlled by Modulation Clock 508. The Modulation Clock 508 drives the process of determining when discrete time samples are taken and when delay elements 506 and 512 are toggled. The frequency of the Modulation Clock 508 should be at least 100 times that of the maximum analog frequency to be sampled, according to standard sigma-delta technology. The output 5 of delay 506 (a one unit delay of the result from addition element 504) is combined with a sampled input signal and the DAC output at addition element 504. The DAC output is subtracted from the result from addition element 504 at addition element 510. The output of delay 512 (a one unit delay of the result from addition element 510 is combined with the output of addition element 504 and the DAC output at addition element 510. The result from addition element 510, delayed an additional time unit by unit delay 512 is input to a digital comparator 516 whose output 514 is a modulated one bit data stream of 1's and 0's corresponding to the input to the comparator relative to its comparator value.

The StiModulator

Figure 1:
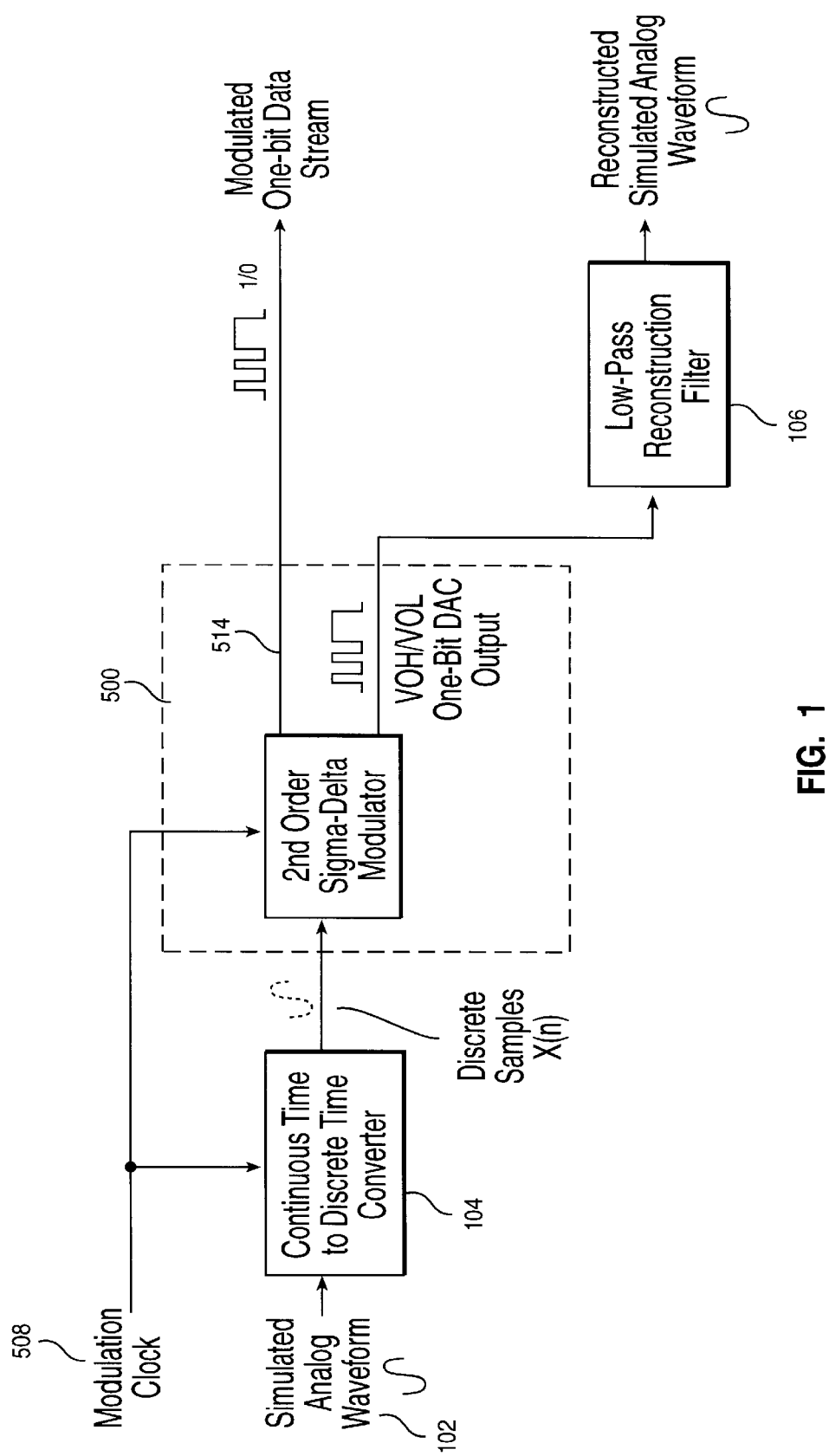
FIG. 1 depicts a Stimodulator with a simulated analog waveform input.

FIG. 1 depicts a Stimodulator with a simulated analog waveform input 102. The Stimodulator receives the simulated analog waveform input 102 which is represented in continuous time. This continuous time input is converted to discrete time samples, X(n), at 104. The conversion of continuous time to discrete time samples is driven by modulation clock 508. Sigma-delta modulator 500, as described in FIG. 5, receives these samples. The 1-bit DAC output of the sigma-delta modulator 500 is input to a reconstruction filter 106. In the presently preferred embodiment the reconstruction filter 106 is a low-pass filter. However, the reconstruction filter can be of any number of designs, for example, a band pass filter, depending on the desired output. The output of the reconstruction filter 106 is a reconstructed simulated analog waveform. This waveform can be used as test stimuli for a software modelled device.

StiModulator Alternative Embodiment

In an alternative embodiment, a band-pass sigma-delta process, for example a second-order band-pass sigma-delta modulator, can be used to allow test frequencies much closer to the sampling frequency of the one-bit or multi-bit sigma delta bit stream.

StiModulator With Analog AC Input

Figure 2:
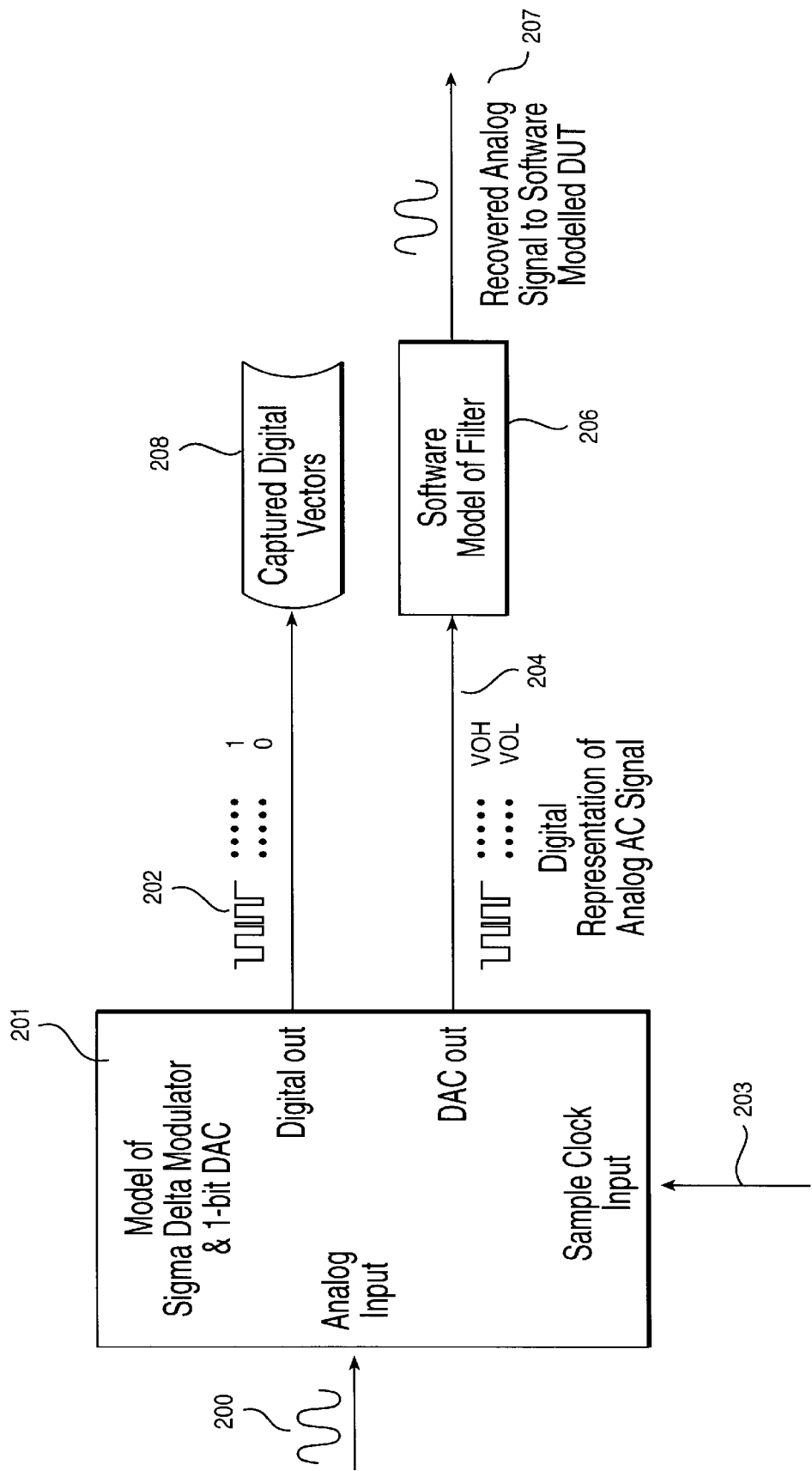
FIG. 2 shows a block diagram of the StiModulator as applied to an AC input signal.

FIG. 2 shows a block diagram of the StiModulator as applied to digitally simulated analog AC input signals. In the presently preferred embodiment, the StiModulator includes a sigma-delta modulator modelled in software. Quantization noise is shaped by the modulator and pushed into frequencies above the band of interest. A sigma-delta modulator converts an analog signal into a continuous stream of 1's and 0's (a very low resolution, e.g. 1-bit resolution) at a very high rate as determined by the sampling clock. The sigma-delta StiModulator 201 receives a simulated analog input signal 200 and clock input signal 203 for derivation of the digital comparator output signal 202 and DAC output signal 204. The DAC output signal 204 voltage levels are designated voltage out high ("VOH") and voltage out low ("VOL"). The digital comparator output signal 202 varies as a logical level from 1 to 0. The digital comparator output signal 202 is fed to a vector file 205 that stores captured digital vectors. The DAC output signal 204 is passed to a low-pass filter modelled in software 206. The recovered analog signal 207 is then applied to the DUT.

StiModulator With Analog DC Input

Figure 3:
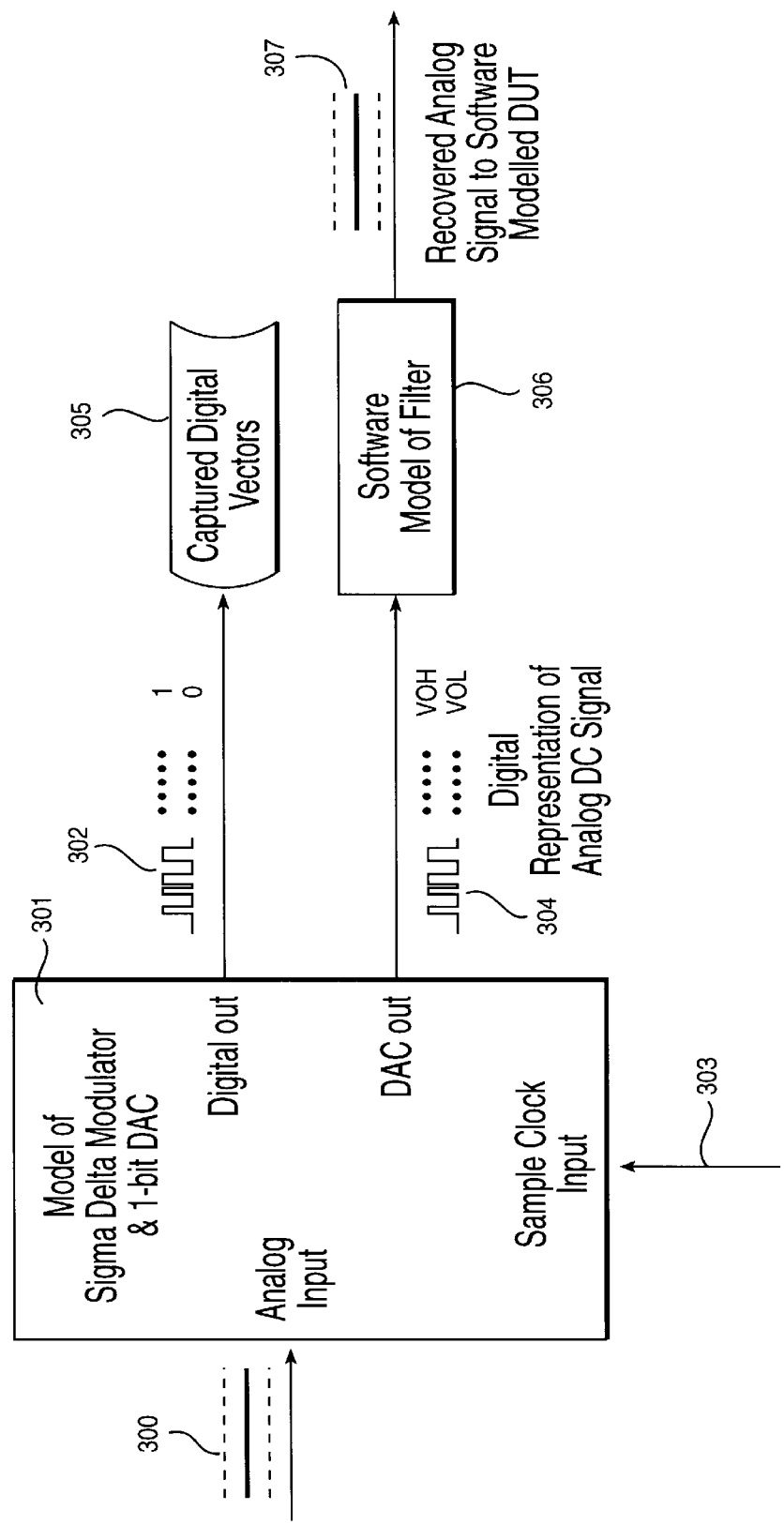
FIG. 3 shows a block diagram of the StiModulator as applied to an DC input signal.

FIG. 3 shows a block diagram of the StiModulator as applied to digitally simulated analog DC input signals. (The term "analog" is used with "AC" and "DC" to differentiate from those signals which are digital.) The sigma-delta modulator 301 receives a digitally simulated analog DC input signal 300 and clock input signal 303 for derivation of the digital comparator output signal 302 and DAC output signal 304. The DAC output signal 304 voltage levels are designated voltage out high ("VOH") and voltage out low ("VOL"). The digital comparator output signal 302 varies as a logical level from 1 to 0. The digital comparator output signal 302 is fed to a vector file 305 that stores captured digital vectors. The DAC output signal 304 is passed to low-pass filter modelled in software 306. The recovered analog signal 307 is then applied to the DUT.

Sample Software Code for the Sigma-Delta Modulation Process

Following is sample software code for the Sigma-Delta Modulator and 1-bit DAC.

```
float sample;                /* Analog input */
int dig_out:                 /* Comparator output */
double mod_sum1;             /* First modulator delay element */
double mod_sum2;             /* Second modulator delay element */
double dac_out;              /* DAC Output */
double VOL=-1.0;             /* Voltage Output Low */
double VOH= 1.0;             /* Voltage Output High */
mod_sum1=0;
mod_sum2=0;
dac_out=VOL;
while(more_samples_exist()) /* For each analog signal sample... */
{
    sample = get_next_analog_sample();
    if(mod_sum2 > 0)    /* Comparator input */
    {
        dig_out=1;              /* comparator output */
        set_dac_output(VOH);    /* Set Modelled DAC Output */
    }
    else
    {
        dig_out=0;              /* Comparator output */
        set_dac_output(VOL);    /* Set Modelled DAC Output */
    }
    /* First modulator delay element & summations */
    mod_sum1 = mod_sum1 + sample - dac_out;
    /* Second modulator delay element & summations */
    mod_sum2 = mod_sum2 + mod_sum1 - dac_out;
}
```

StiModulator System Implementation

Figure 4A:
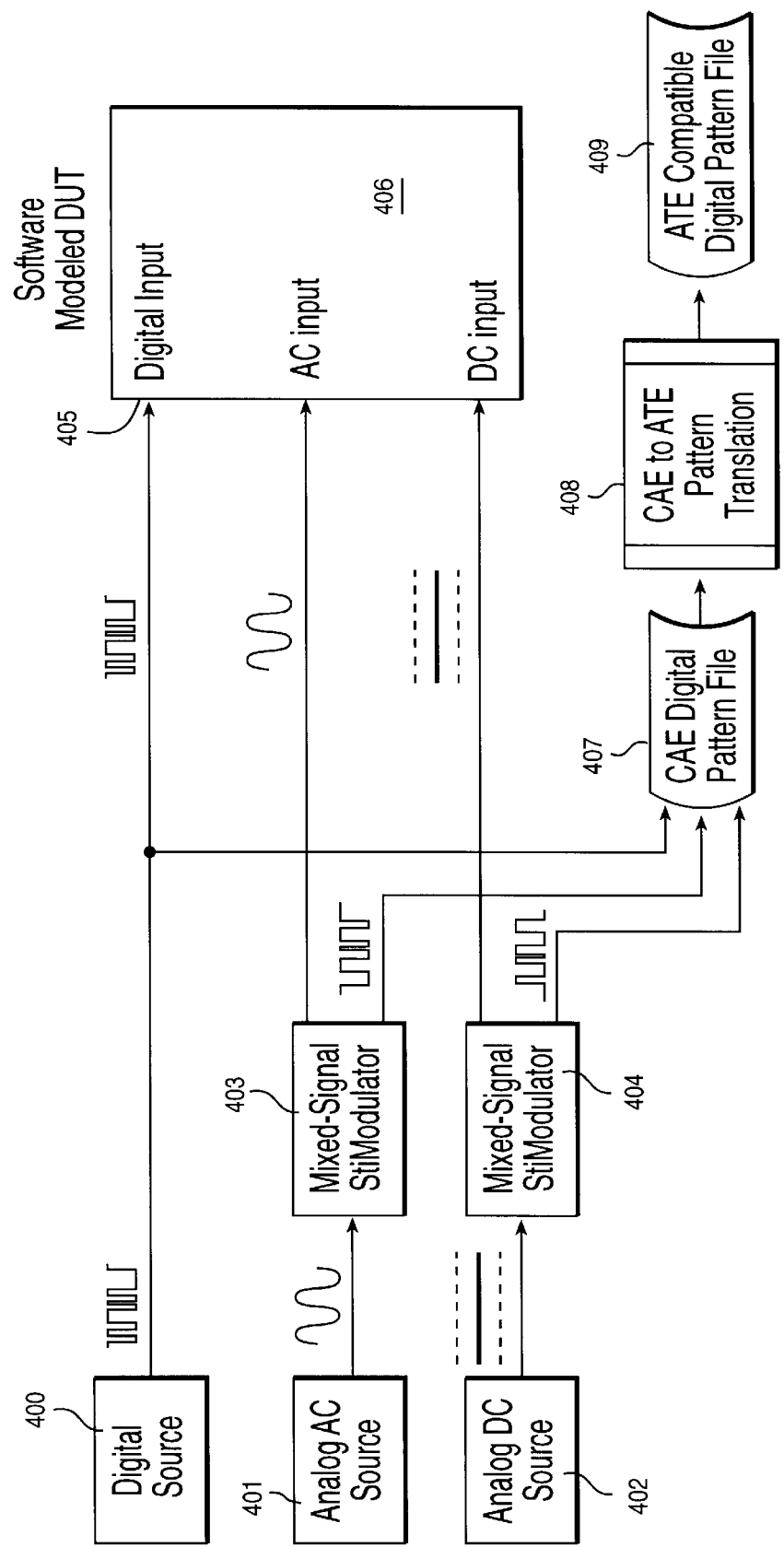
FIGS. 4A & 4B show a block diagram of a system employing StiModulators when applying a mixed-signal stimulus to a software-modelled DUT connected in both the design test-bench, and physical ATE hardware configurations.

FIG. 4A shows a block diagram of a system when the StiModulator is employed with a software-modelled DUT 406 during test-bench simulations. In this particular embodiment, three signal sources are used; a digital source 400, a digitally simulated analog AC source 401, and a digitally simulated analog DC source 402. The digital source 400 signal is applied to a software modulated DUT digital input 405 and stored in a CAE pattern file 407. The analog AC source 401 signal feeds a first StiModulator 403. The output of the Stimodulator 403 is a digitally simulated analog output which is passed to the software modelled DUT 406 AC input. The first Stimulator 403 also has a digital signal output which is a modulated representation of the analog input that is passed to the CAE pattern file 407 for storage. A second StiModulator 404 operates similarly to the first StiModulator 403, by receiving an analog input signal from the analog DC source 402. The output of the Stimodulator 404 is a digitally simulated analog output which is passed to the software modelled DUT 406 DC input. Additionally, a second output of the second StiModulator 404 passes a modulated representation of the analog input signal (a digital signal) to the digital pattern file 407 for storage. In the presently preferred embodiment, the digital pattern file is in a CAE format. However, if a particular ATE pattern will be used for testing, it is possible to create and save the ATE digital patterns directly without the need for an intermediate CAE-to-ATE translation. In the presently preferred embodiment, the contents of the CAE digital pattern file 407 is then passed to the CAE-to-ATE pattern translator 408. The translator 408 compiles the CAE pattern file 407 contents into an ATE-compatible digital pattern format for storage in the ATE digital pattern file 409, and for eventual use with the ATE system.

Figure 4B:
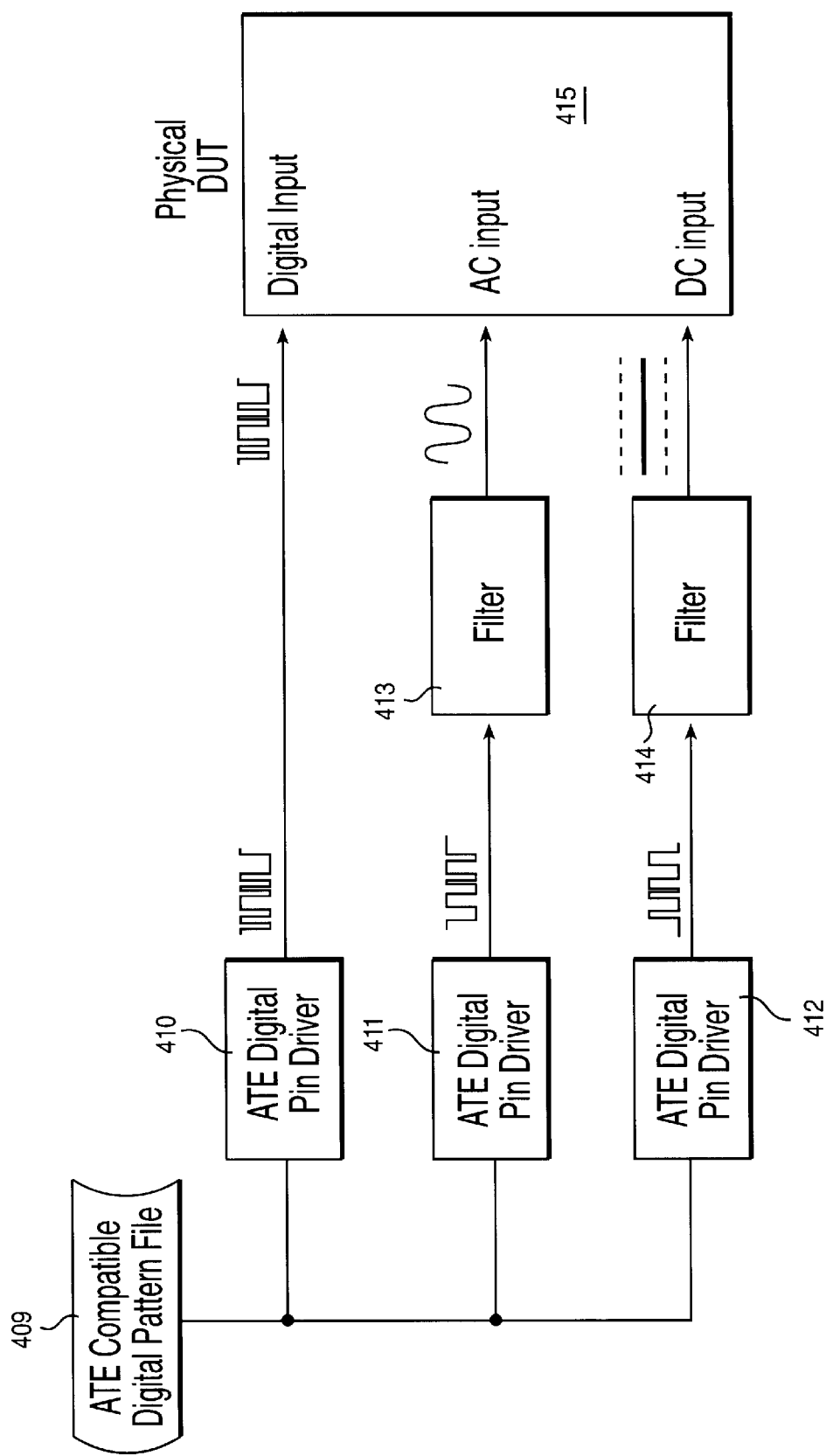

FIG. 4B shows a physical DUT 415 utilized with the physical ATE hardware. The contents of the ATE pattern file 409 (digital representation of the modulated analog AC and DC source signals, and digital source signal) are converted back (demodulated) to their respective constituent signals. The digitally simulated analog AC and DC signals are reconstructed to an ATE format by passing their respective vector 407 information through two ATE one-bit DACs (digital pin drivers 411 and 412) and through respective reconstruction filters (413 and 414). In the presently preferred embodiment, the reconstruction filters are low-pass filters. However, the type of filter used in applying signals to the physical DUT 415 should match the filter used in application of the signals to the software modelled DUT 406. The output signals of these filters are then applied to the DUT 15 AC and DC inputs, respectively. Thus, the digitally simulated analog signals applied to the software modelled DUT 406 and the signals applied to the physical DUT 415 are both processed in the same manner. The remaining ATE digital pin driver 410 output signal is passed directly to the DUT 415 digital input.

Further details of the system context and of options for implementation may be found in Yannis Tsividis, MIXED ANALOG-DIGITAL VLSI DEVICES AND TECHNOLOGY (1996); IEEE Press, DELTA-SIGMA DATA CONVERTERS, THEORY, DESIGN, AND SIMULATION (1996); Bapiraju Vinakota, ANALOG AND MIXED-SIGNAL TEST (1998); and Matthew Mahoney, TUTORIAL DSP-BASED TESTING OF ANALOG AND MIXED-SIGNAL CIRCUITS (1987); Lawrence Pillage, et al., ELECTRONIC CIRCUIT AND SYSTEM SIMULATION METHODS (1995); Kenneth Kundert, THE DESIGNER'S GUIDE TO SPICE & SPECTRE (1995); H. Alan Mantooth and Mike Fiegenbaum, MODELING WITH AN ANALOG HARDWARE DESCRIPTION LANGUAGE (1995); Samir Palnitkar, VERIOG HDL—A GUIDE TO DIGITAL DESIGN AND SYNTHESIS (1994), all of which are hereby incorporated by reference.

According to a disclosed class of innovative embodiments, there is provided: a method for translating mixed-signal design test bench generated signals into an Automated-Test-Equipment compatible format, comprising the steps of: converting a first analog signal of one or more analog signals provided to a first device-under-test into at least a first software-readable format; reconstructing said software-readable format into an approximation of said first analog signal for application back to a first or second device-under-test.

According to another disclosed class of innovative embodiments, there is provided: a method for translating design test bench generated signals into an Automated-Test-Equipment compatible format, comprising the steps of: providing one or more analog test signals to a first device-under-test; converting said analog test signals into a Computer-Aided-Engineering digital format to produce first digital representations of said analog signals; storing said first digital representations in a first file; translating said first digital representations into the Automated-Test-Equipment digital format to produce second digital representations; storing said second digital representations in a second file; and reconstructing said second digital representations into an approximation of said analog signals for application to a first or second device-under-test.

According to another disclosed class of innovative embodiments, there is provided: A mixed-signal design test bench system, comprising: first and second devices for testing; a mix of signals comprising one or more analog input signals and one or more digital input signals, for stimulating said first device; and at least one StiModulator for converting one of said analog input signals into a digital representations, comprising a converter which converts one of said analog input signals into discrete time samples; a modulator connected to receive said discrete time samples and create a modulated one-bit data stream and a digital-to-analog converted output; and a reconstruction circuit connected to receive said digital-to-analog converted output and construct an analog output signal which substantially represents said converted analog input signal, for application to said first or second device.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, a second-order sigma-delta modulator is described as the ADC of the StiModulator. However, a first-order or higher-order sigma-delta modulator may be used to obtain a digital bit stream.

For another example a multi-bit sigma-delta modulator process can be used to increase the signal to noise ratio of the converted analog stimuli.

For another example, the modulator described is a sigma-delta modulator. However, any modulator which produces a modulated bit stream may be used in the StiModulator.

For another example, a process which includes converting StiModulator output CAE patterns to ATE compatible patterns has been disclosed. However, it is possible to convert the StiModulator output directly to an ATE format used by a particular test platform without the need for an CAE compatible pattern. Furthermore, it is anticipated that an ATE pattern standard, Standard Test Interface Language (STIL™), will be developed which will be used as a common format by most mixed-signal test platforms. Therefore, the output of the StiModulator can be made to meet such a standard, eliminating the need for further translation for use of the signal by a mixed-signal test platform.

It should also be noted that, over time, an increasing number of functions tend to be combined into a single chip. The disclosed inventions can still be advantageous even with different allocations of functions among chips, as long as the functional principles of operation described above are still observed.

What is claimed is:

1. A method for translating mixed-signal design test bench generated signals into an Automated-Test-Equipment compatible format, comprising the steps of:
   converting a first analog signal of one or more analog signals provided to a first device-under-test into at least a first software-readable format using a sigma-delta software modulation process;
   reconstructing said software-readable format into an approximation of said first-analog signal for application back to a first or second device-under-test.

2. The method of claim 1, wherein said analog signals are digitally simulated.

3. The method of claim 1, wherein said first device-under-test is software modelled.

4. The method of claim 1, wherein said second device-under-test is a physical device-under-test.

5. The method of claim 1, further comprising the step of storing the result of said converting step in a file.

6. The method of claim 1, wherein said converting step is accomplished by a one-bit sigma-delta modulation process.

7. The method of claim 1, wherein said converting step is accomplished by a low-pass sigma-delta modulator process.

8. The method of claim 1, wherein said reconstructing step is accomplished by a low-pass filter.

9. The method of claim 1, wherein said converting step is accomplished by a band-pass sigma-delta modulator process.

10. The method of claim 1, wherein said reconstructing step is accomplished by a band-pass filter.

11. The method of claim 1, wherein said converting step is accomplished by a multi-bit low-pass sigma-delta modulation process.

12. The method of claim 1, wherein said reconstructing step is accomplished by a multi-bit DAC and a low-pass filter.

13. The method of claim 1, wherein said converting step is accomplished by a multi-bit band-pass sigma-delta modulation process.

14. The method of claim 1, wherein said reconstructing step is accomplished by a multi-bit DAC and a band-pass filter.

15. The method of claim 1, wherein said first software-readable format is the Computer-Aided-Engineering digital format.

16. The method of claim 1, wherein one of said software-readable formats is the Automated-Test-Equipment digital format.

17. A method for translating design test bench generated signals into an Automated-Test-Equipment compatible format, comprising the steps of:
   providing one or more analog test signals to a first device-under-test;
   converting said analog test signals into a Computer-Aided-Engineering digital format to produce first digital representations of said analog signals using a sigma-delta software modulation process;
   storing said first digital representations in a first file;
   translating said first digital representations into the Automated-Test-Equipment digital format to produce second digital representations;
   storing said second digital representations in a second file; and
   reconstructing said second digital representations into an approximation of said analog signals for application to a first or second device-under-test.

18. The method of claim 17, wherein said analog signals are digitally simulated.

19. The method of claim 17, wherein said converting step is accomplished by a one-bit sigma-delta modulation process.

20. The method of claim 17, wherein said converting step is accomplished by a low-pass sigma-delta modulator process.

21. The method of claim 17, wherein said reconstructing step is accomplished by a low-pass filter.

22. The method of claim 17, wherein said converting step is accomplished by a band-pass sigma-delta modulator process.

23. The method of claim 17, wherein said reconstructing step is accomplished by a band-pass filter.

24. A mixed-signal design test bench system, comprising:
   first and second devices for testing;
   a mix of signals comprising one or more analog input signals and one or more digital input signals, for stimulating said first device; and
   at least one StiModulator for converting one of said analog input signals into a digital representations, comprising a converter which converts one of said analog input signals into discrete time samples using a sigma-delta software modulation process;

a modulator connected to receive said discrete time samples and create a modulated one-bit data stream and a digital-to-analog converted output; and a reconstruction circuit connected to receive said digital-to-analog converted output and construct an analog output signal which substantially represents said converted analog input signal, for application to said first or second device.

25. The system of claim 24, wherein said analog signals are digitally simulated.

26. The system of claim 24, further comprising a translation tool for converting said digital representation of said analog input signals into a file format compatible with a design test bench system.

27. The system of claim 24, further comprising a file for storing said digital representation of said analog signals.

28. The system of claim 24, further comprising a translation tool for converting said digital representation of said analog input signals into a file format compatible with a design test bench system and a file for storing said digital representation in said file format compatible with a design test bench system.

29. The system of claim 24, wherein said modulator comprises a one-bit sigma-delta modulation process.

30. The system of claim 24, wherein said digital representation is in the Computer-Aided-Engineering digital format.

31. The system of claim 24, wherein one of said file format compatible with a design test bench system is the Automated-Test-Equipment digital format.

* * * * *